United States Patent
Huang et al.

(10) Patent No.: US 6,667,546 B2
(45) Date of Patent: Dec. 23, 2003

(54) BALL GRID ARRAY SEMICONDUCTOR PACKAGE AND SUBSTRATE WITHOUT POWER RING OR GROUND RING

(75) Inventors: Chien-Ping Huang, Hsinchu (TW); Eric Ko, Taichung (TW); Chih-Ming Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 9 days.

(21) Appl. No.: 10/039,884

(22) Filed: Jan. 3, 2002

(65) Prior Publication Data
US 2003/0089983 A1 May 15, 2003

(30) Foreign Application Priority Data
Nov. 15, 2001 (TW) .......................... 90128304 A

(51) Int. Cl.[7] .......................... H01L 23/10; H01L 23/34
(52) U.S. Cl. .................. 257/691; 257/696; 257/698; 257/666; 257/673; 257/712; 257/713; 257/774; 257/737; 257/738; 257/784; 257/786; 257/717; 257/720; 257/707; 257/796
(58) Field of Search ................ 257/738, 737, 257/734, 784, 786, 712, 713, 717, 720, 690, 691, 969, 698, 774, 707, 706, 673, 666, 796

(56) References Cited

U.S. PATENT DOCUMENTS

| | | | |
|---|---|---|---|
| 5,545,923 A | 8/1996 | Barber | 257/691 |
| 5,581,122 A | 12/1996 | Chao et al. | 257/691 |
| 5,726,860 A | 3/1998 | Mozdzen | 361/761 |
| 5,841,191 A * | 11/1998 | Chia et al. | 257/691 |
| 5,894,410 A * | 4/1999 | Barrow | 361/760 |
| 5,977,626 A * | 11/1999 | Wang et al. | 257/707 |
| 6,146,921 A * | 11/2000 | Barrow | 438/122 |
| 6,340,846 B1 * | 1/2002 | LoBianco et al. | 257/783 |
| 6,432,742 B1 * | 8/2002 | Guan et al. | 438/106 |
| 6,448,639 B1 * | 9/2002 | Ma | 257/691 |
| 2001/0019181 A1 * | 9/2001 | Lee et al. | 257/796 |
| 2002/0008311 A1 * | 1/2002 | Kimura | 257/690 |
| 2002/0113308 A1 * | 8/2002 | Huang et al. | 257/717 |

* cited by examiner

Primary Examiner—Alexander O. Williams
(74) Attorney, Agent, or Firm—Peter F. Corless; Steven M. Jensen; Edwards & Angell, LLP

(57) ABSTRACT

A ball grid array semiconductor package is proposed, wherein at least a chip is mounted on a substrate, and signal pads on the chip are electrically connected to signal fingers on the substrate by bonding wires. A power plate and a ground plate are each attached at two ends thereof respectively to predetermined positions on the chip and substrate, without interfering with the bonding wires. No power ring or ground ring is necessarily formed on the substrate, thereby reducing restriction on trace routability of the substrate. Further, with no provision of power wires or ground wires, short circuit of the bonding wires is less likely to occur, and thus production yield is enhanced. In addition, the power plate and ground plate provide shielding effect for protecting the chip against external electric-magnetic interference, and are partly in direct contact with the atmosphere for improving heat dissipating efficiency of the semiconductor package.

20 Claims, 5 Drawing Sheets

BALL GRID ARRAY SEMICONDUCTOR PACKAGE AND SUBSTRATE WITHOUT POWER RING OR GROUND RING

FIELD OF THE INVENTION

The present invention relates to semiconductor packages, and more particularly, to a BGA (ball grid array) semiconductor package with improvements in electrical and heat dissipating efficiency.

BACKGROUND OF THE INVENTION

A BGA (ball grid array) semiconductor package, a main stream of package products, is characterized of implanting a plurality of array-arranged solder balls on a bottom surface of a substrate. The solder balls acting as I/O (input/output) connections are densely arranged in response to high density of electronic components and electronic circuits incorporated with a semiconductor chip, so that the BGA semiconductor package can be applied to electronic products in favor of desirable advantages such as high electrical performance and processing speed. The solder balls deposited on the substrate are used to electrically connect the semiconductor chip to external devices e.g. printed circuit board (PCB), allowing the semiconductor package to operate with multiple functions of grounding, powering, signaling. Therefore, the substrate is formed with corresponding mechanisms that are electrically connected to the differently functioned solder balls, in an effort to achieve desirable performances of internal elements in operation of the semiconductor package.

Accordingly, U.S. Pat. Nos. 5,581,122, 5,545,923 and 5,726,860 disclose the configuration of forming a ground ring, a power ring and signal fingers on a substrate. As shown in FIGS. 5 and 6 of a semiconductor structure 1, on an upper surface 100 of a substrate 10 there are provided a ground ring 11, a power ring 12 and a plurality of signal fingers 13 at positions outside a chip attach region 101. After a chip 14 is mounted on the chip attach region 101, a wire bonding process is performed, and a plurality of ground wires 15, power wires 16 and signal wires 17 are formed for electrically connecting bond pads 140 disposed on the chip 14 to the ground ring 11, the power ring 12 and the signal fingers 13, respectively. Then, in subsequent processes, a plurality of solder balls 18 are implanted on a lower surface 102 of the substrate 10, and electrically connected to the ground ring 11, the power ring 12 and the signal fingers 13 by conductive traces 19, respectively. This therefore makes the semiconductor structure 1 capable of being electrically connected to an external device (not shown) for chip operation. It should be understood that, the drawings are made in simplicity with illustration of only associated elements relating to the invention; in practice, a semiconductor structure is much more complex in element layout and arrangement.

However, the foregoing semiconductor structure is endowed with multiple drawbacks. First, the ground ring and the power ring significantly occupy surface area of the substrate; this undesirably restricts trace routability on the substrate, and also makes the substrate not able to be further reduced in dimensions, which is not in favor of profile miniaturization. Moreover, in order to reduce signal interference, a decoupling pad (not shown) is usually incorporated in the conventional semiconductor structure, and may further limit the trace routability on the substrate. In addition, the need of making many ground wires, power wires and signal wires greatly increases the complexity of fabricating processes. As shown in FIG. 5, these wires are arranged with multiple layers of wire loops, and different layers of wire loops need to be precisely controlled in elevation for allowing the wire loop layers to be properly spaced apart from each other. This undoubtedly increases the difficulty in fabrication; for example, during injection of a molding resin used in a molding process, impact of the mold flow may easily lead to adjacent wire loops coming into contact with each other and results in short circuit, thereby making quality and yield of products seriously damaged.

SUMMARY OF THE INVENTION

A primary objective of the present invention is to provide a BGA semiconductor package with no provision of a power ring and a ground ring.

Another objective of the invention is to provide a BGA semiconductor package without forming power wires and ground wires.

Still another objective of the invention is to provide a BGA semiconductor package, which does not increase the restriction on trace routability of a substrate.

A further objective of the invention is to provide a BGA semiconductor package, so as to increase heat dissipating efficiency and provide an EMI (electric Magnet Interference) shielding effect for the semiconductor package.

In accordance with the above and other objectives, the present invention proposes a BGA semiconductor package, comprising: a substrate having a first surface and an opposing second surface, the first surface being formed with a chip attach region and a plurality of signal fingers surrounding the chip attach region, the first surface further being defined with a power attach region and a ground attach region in proximity to two sides of the substrate at positions outside the signal fingers; at least a chip having an active surface and an opposing non-active surface, the active surface being disposed with a plurality of signal pads, power pads and ground pads at peripheral area thereof, wherein the power pads are consolidated to form a power plane on the active surface of the chip and electrically connected to the power plane, and the ground pads are consolidated to form a ground plane on the active surface of the chip and electrically connected to the ground plane; the non-active surface of the chip being attached to the chip attach region of the substrate in a manner that, the power plane and the ground plane of the chip face toward the power attach region and the ground attach region on the substrate, respectively; a plurality of bonding wires for electrically connecting the signal pads of the chip to the signal fingers on the first surface of the substrate; a power plate with two ends thereof being respectively attached to the power plane of the chip and the power attach region of the substrate in a manner free of interference with layout of the bonding wires; a ground plate with two ends thereof being respectively attached to the ground plane of the chip and the ground attach region of the substrate in a manner free of interference with layout of the bonding wires; an encapsulant formed on the first surface of the substrate, for encapsulating the chip, the bonding wires, the power plate and the ground plate.

A plurality of signal ball pads, power ball pads and ground ball pads are disposed at predetermined positions on the second surface of the substrate. A plurality of vias penetrating the substrate are used to electrically connect the signal ball pads to the signal fingers on the first surface of the substrate, and electrically connect the power ball pads and the ground ball pads to the power attach region and the ground attach region on the first surface of the substrate, respectively. And, the solder balls are implanted at the signal ball pads, the power ball pads and the ground ball pads on the second surface of the substrate. Moreover, the power pads and the ground pads on the active surface of the chip are re-distributed to form a plurality of traces, which traces consolidate and electrically connect the power pads and the ground pads to the power plane and the ground plane, respectively.

The metal-made power plate is composed of a protruding portion, a flat portion and a supporting portion, wherein the protruding portion is attached to the power plane of the chip, and the supporting portion is attached to the power attach region of the substrate, allowing the flat portion to be elevated in position above the chip by the protruding portion and the supporting portion in a manner free of interference with the bonding wires. Similarly, the metal-made ground plate includes a protruding portion, a flat portion and a supporting portion. The protruding portion of the ground plate is attached to the ground plane of the chip, and the supporting portion is attached to the ground attach region of the substrate, allowing the flat portion to be elevated in position above the chip by the protruding portion and the supporting portion in a manner free of interference with the bonding wires.

Compared to a conventional semiconductor package, the invention is characterized of adopting the power plate and the ground plate in place of power wires and ground wires, and has many advantages as follows. First, since there is no need to form a power ring or a ground ring on the substrate, restriction on trace routability of the substrate due to substrate occupation of the power or ground ring, can be reduced. Further, with no provision of power wires or ground wires, during a molding process, short circuit is less likely to occur at the bonding wires for interconnecting the signal pads of the chip and the signal fingers of the substrate; this thereby simplifies fabrication processes and enhances production yield. In addition, the power plate and ground plate provide shielding effect for protecting the chip against external electric-magnetic interference, allowing performances of the semiconductor package to be desirably improved.

In another aspect, a top surface of the flat portion of the power plate is flush with a top surface of the flat portion of the ground plate, and the flush top surfaces are exposed to outside of the encapsulant. The exposed surfaces of the power plate and the ground plate therefore facilitate dissipation of heat generated from the chip, so as to effectively improve heat dissipating efficiency of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

First Preferred Embodiment

Figure 1:
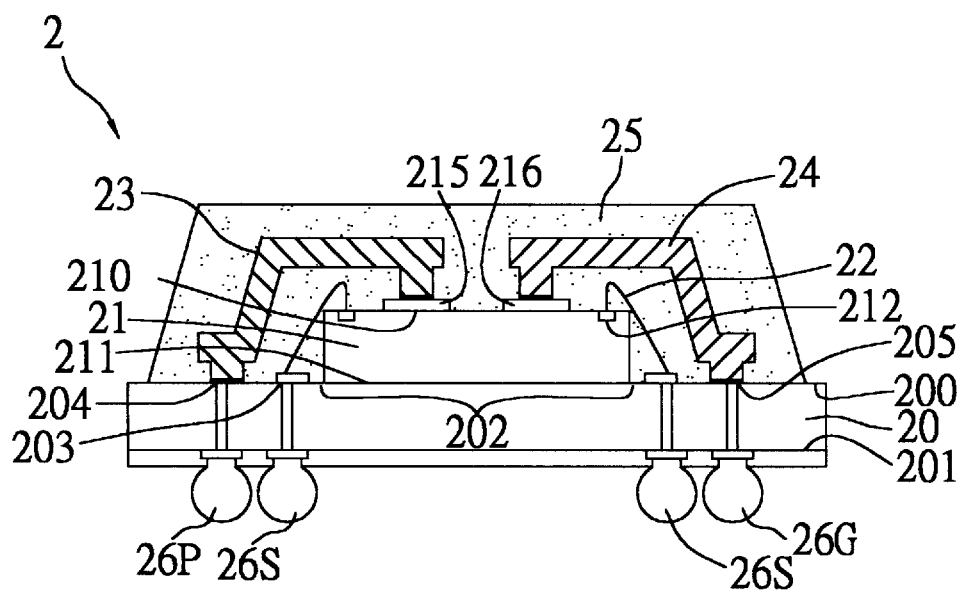
FIG. 1 is a cross-sectional view of a first preferred embodiment of a semiconductor package of the invention.

FIG. 1 illustrates a BGA semiconductor package 2 of the present invention; FIG. 2 illustrates a chip 21 used in the semiconductor package 2 of the invention. The semiconductor package 2 comprises: a substrate 20 having a first surface 200 and an opposing second surface 201, wherein the first surface 200 of the substrate 20 is formed with a chip attach region 202 and a plurality of signal fingers 203 surrounding the chip attach region 202. A power attach region 204 and a ground attach region 205 are respectively defined in proximity to two sides on the first surface 200 of the substrate 20 at positions outside the signal fingers 203.

At least a chip 21 having an active surface 210 and an opposing non-active surface 211, is attached at its non-active surface 211 onto the first surface 200 of the substrate 20. A plurality of signal pads 212, power pads 213 and ground pads 214 are formed at peripheral area on the active surface 210 of the chip 21. The power pads 213 and the ground pads 214 are respectively re-distributed and consolidated to form a power plane 215 and a ground plane 216, and electrically connected to the power plane 215 and the ground plane 216. The chip 21 is mounted on the substrate 20 in a manner that, the power plane 215 and the ground plane 216 of the chip 21 face toward the power attach region 204 and the ground attach region 205 of the substrate 20, respectively.

A plurality of bonding wires 22 are formed for electrically connecting the signal pads 212 on the active surface 210 of the chip 21 to the signal fingers 203 on the first surface 200 of the substrate 20.

A power plate 23 is bridged between the chip 21 and the substrate 20 without interfering with layout of the bonding wires 22 in a manner that, two ends of the power plate 23 are attached to the power plane 215 on the active surface 210 of the chip 21 and the power attach region 204 on the first surface 200 of the substrate 20, respectively. Similarly, a ground plate 24 is bridged between the chip 21 and the substrate 20 in a manner free of interference with layout of the bonding wires 22, and two ends of the ground plate 24 are respectively attached to the ground plane 216 on the active surface 210 of the chip 21 and the ground attach region 205 on the first surface 200 of the substrate 20.

An encapsulant 25 is formed on the first surface 200 of the substrate 20, for encapsulating the chip 21, the bonding wires 22, the power plate 23 and the ground plate 24. Finally, a plurality of signal balls 26S, power balls 26P and ground balls 26G are implanted on the second surface 201 of the substrate 20.

Figure 2A:
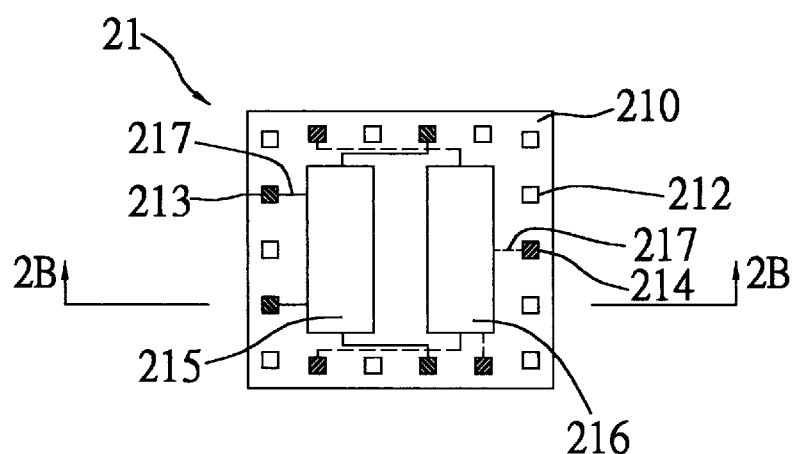
FIG. 2A is a top view of a chip used in a semiconductor package of the invention.
Figure 2B:
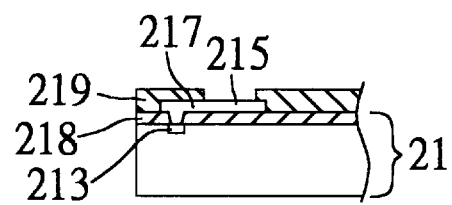
FIG. 2B is a partial cross-sectional view of FIG. 2A cutting through a line 2B—2B.
Figure 3A:
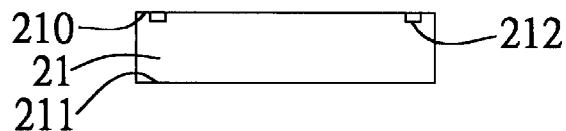
FIGS. 3A–3F are schematic diagrams showing fabrication processes of a first preferred embodiment of a semiconductor package of the invention.

The foregoing semiconductor package 2 can be fabricated by the following steps illustrated in FIGS. 3A to 3F. Referring first to FIG. 3A, a chip 21 having an active surface 210 and an opposing non-active surface 211 is prepared. As shown in FIG. 2, a plurality of signal pads 212, power pads 213 and ground pads 214 are disposed at peripheral area on the active surface 210 of the chip 21. Since these bond pads 212, 213, 214 are formed by using conventional technology, no further description thereof is detailed herein. It should be understood that, the number of the bond pads is exemplified in the drawing for the sake of simplicity, which number is flexibly adjusted according to practical need.

Figure 3B:
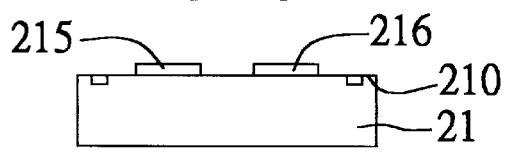

Referring to FIGS. 3B and 2A, the power pads 213 are re-distributed to form a plurality of traces 217 on the active surface 210 of the chip 21, allowing the power pads 213 to be consolidated to form a power plane 215 and electrically connected to the power plane 215 by the traces 217. Similarly, the ground pads 214 are formed in a redistribution manner with a plurality of the traces 217, which traces 217 are consolidated to form a ground plane 216, and electrically connect the ground pads 214 to the ground plane 216. As shown in FIG. 2B, the re-distribution technology is accomplished by first using an electrically conductive material such as aluminum or copper to form a trace 217 on a power pad 213 that is partly exposed to outside of a passive film 218 and all the traces 217 on the power pad 21 are consolidated to form the power plane 21. Then, an insulative material such as silicon oxide or silicon nitride is applied on the trace 217 to form another passive film 219, while passive film 219 is partly removed to expose the power plane 215. Similarly, the ground plane 216 is also formed for the ground pads 214 by using the same method illustrated in FIG. 2B, and thus it is not further described herein.

Figure 3C:
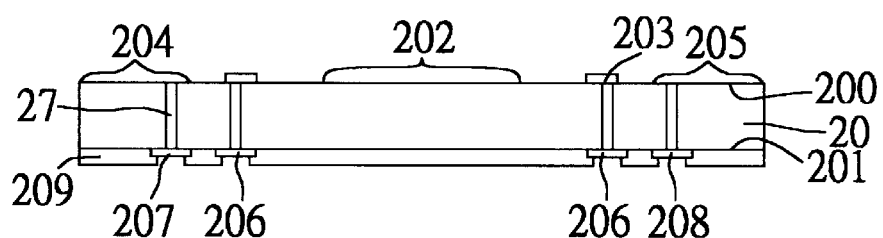

Referring to FIG. 3C, a substrate 20 having a first surface 200 and an opposing second surface 201 is prepared. The first surface 200 of the substrate 20 is defined with a chip attach region 202, and a plurality of signal fingers 203 are disposed around the chip attach region 202. A power attach region 204 and a ground attach region 205 are respectively formed in proximity to two sides on the first surface 200 of the substrate 20 at positions outside the signal fingers 203.

The second surface 201 of the substrate 20 is formed at predetermined positions with a plurality of signal ball pads 206, power ball pads 207 and ground ball pads 208 thereon. Further, a solder mask layer 209 is applied on the second surface 201 of the substrate 20 for protection purpose, and the ball pads 206, 207, 208 are partly exposed to outside of the solder mask layer 209, for use in subsequent solder ball implantation. Moreover, the substrate 20 is formed with a plurality of penetrating vias 27 for electrically connecting the signal ball pads 206 to the signal fingers 203 on the first surface 200 of the substrate 20. Also, the vias 27 allow the power ball pads 207 and the ground ball pads 208 to be electrically connected to the power attach region 204 and the ground attach region 205 on the first surface 200 of the substrate 20, respectively.

Figure 3D:
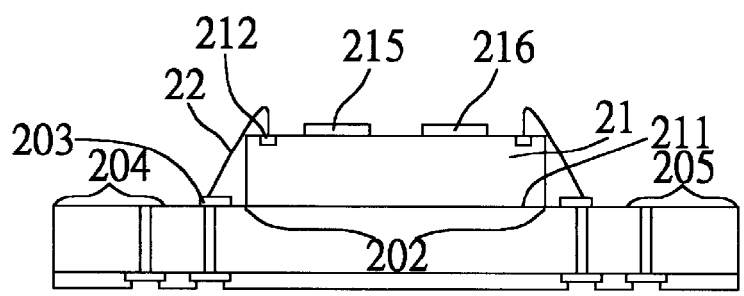

Referring to FIG. 3D, the non-active surface 211 of the chip 21 is attached onto the chip attach region 202 on first surface 200 of the substrate 20 in a manner that, the power plane 215 and the ground plane 216 on the chip 21 face toward the power attach region 204 and the ground attach region 205 of the substrate 20, respectively. Then, a wire bonding process is performed to form a plurality of bonding wires 22 such as gold wires, which are used to electrically connect the signal pads 212 on the chip 21 to the signal fingers 203 on the first surface 200 of the substrate 20.

Figure 3E:
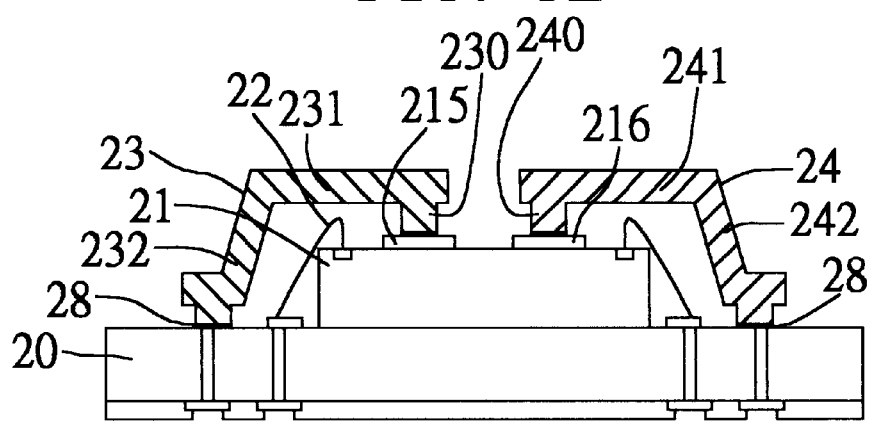

Referring to FIG. 3E, a metal-made power plate 23 is adhered at its two ends respectively onto the chip 21 and the substrate 20 by an electrically conductive adhesive 28 such as silver paste. The power plate 23 is composed of a protruding portion 230, a flat portion 231 and a supporting portion 232, wherein the protruding portion 230 is attached to the power plane 215 of the chip 21, and the supporting portion 232 is attached to the power attach region 204 of the substrate 20, allowing the flat portion 231 to be elevated in position above the chip 21 by the protruding portion 230 and the supporting portion 232 in a manner free of interference with layout of the bonding wires 22. Similarly, the electrically conductive adhesive 28 is also adopted to adhere two ends of a metal-made ground plate 24 respectively onto the chip 21 and the substrate 20. The ground plate 24 is formed with a protruding portion 240, a flat portion 241 and a supporting portion 242. The protruding portion 240 of the ground plate 24 is attached to the ground plane 216 of the chip 21, and the supporting portion 242 is attached to the ground attach region 205 of the substrate 20, allowing the flat portion 241 to be elevated in position above the chip 21 by the protruding portion 240 and the supporting portion 242 in a manner as not to interfere with layout of the bonding wires 22. It should be understood that, the shape of the power plate 23 and the ground plate 24 in this embodiment is illustrated only for the sake of exemplification, and other shapes thereof applicable for achieving desirable purposes are also included within the scope of the invention.

Figure 3F:
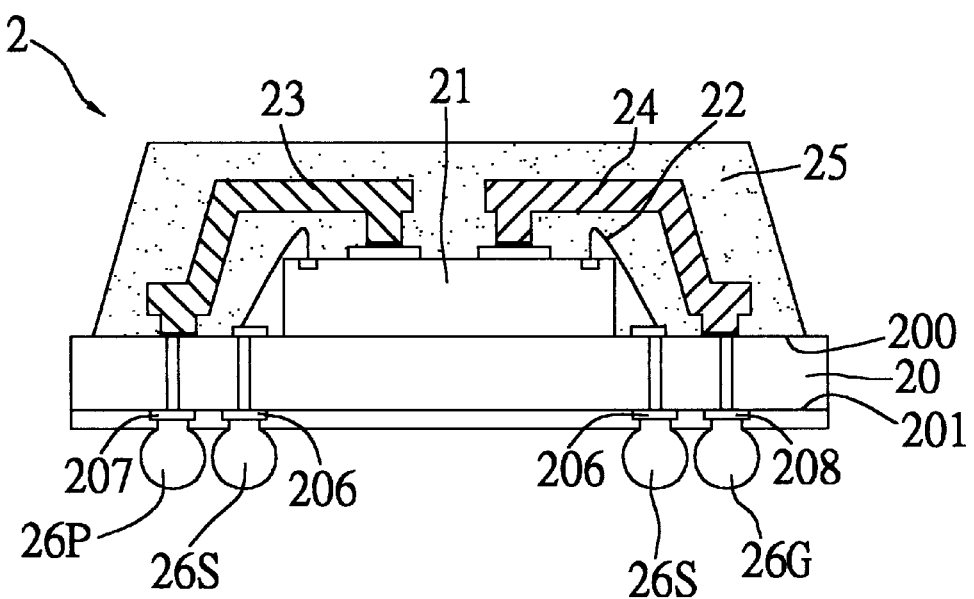

Referring finally to FIG. 3F, a molding process is performed. A resin compound such as epoxy resin is used to form an encapsulant 25 on the first surface 200 of the substrate 20, allowing the chip 21, the bonding wires 22, the power plate 23 and the ground plate 24 to be encapsulated and protected by the encapsulant 25 against external moisture or contaminant. Then, a ball implantation process is performed, in which a plurality of signal balls 26S, power balls 26P and ground balls 26G are respectively implanted at the signal ball pads 206, the power ball pads 207 and the ground ball pads 208 on the second surface 201 of the substrate 20. These solder balls 26S, 26P, 26G allow the chip 21 to be electrically connected to external devices (not shown). This therefore completes the fabrication of the semiconductor package 2 of the invention. Since the molding and ball implantation processes are conventional, they are not further described herein.

Compared to a conventional semiconductor package, the invention is characterized of adopting a power plate and a ground plate in place of power wires and ground wires, and endowed with many advantages as follows. First, since there is no need to form a power ring or a ground ring on a substrate, restriction on trace routability of the substrate due to substrate occupation of the power or ground ring, can be reduced. Further, with no provision of power wires or ground wires, during a molding process, short circuit is less likely to occur at bonding wires for interconnecting signal pads on a chip and signal fingers of the substrate; this thereby simplifies fabrication processes and enhances production yield. In addition, the power plate and ground plate provide shielding effect for protecting the chip against external electric-magnetic interference, allowing performances of the semiconductor package to be desirably improved.

Second Preferred Embodiment

Figure 4:
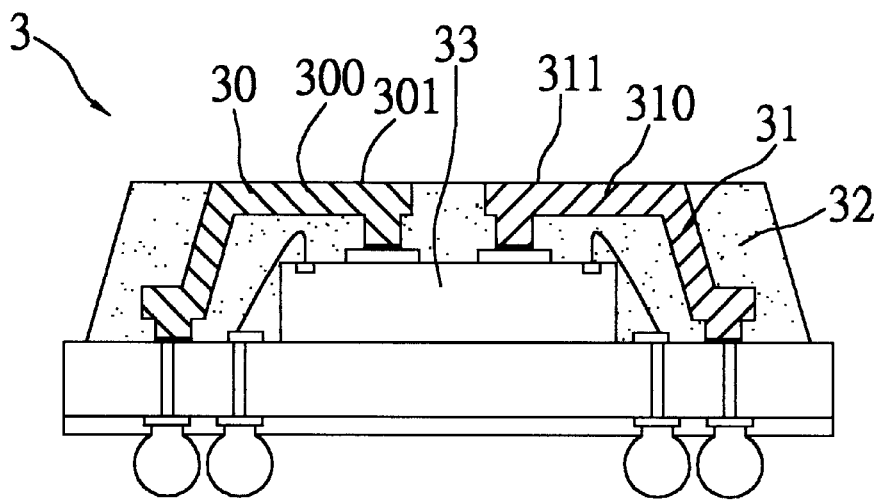
FIG. 4 is a cross-sectional view of a second preferred embodiment of a semiconductor package of the invention.
Figure 5:
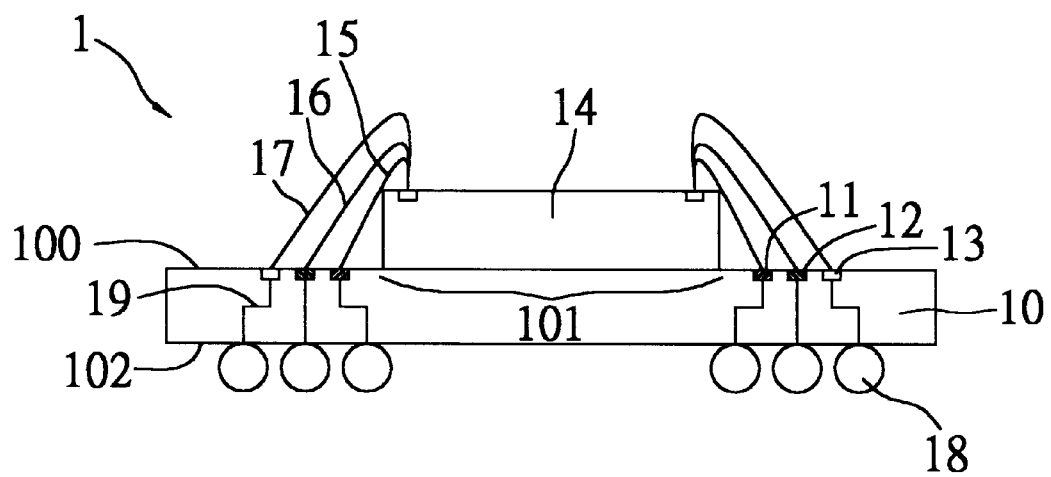
FIG. 5 (PRIOR ART) is a cross-sectional view of a conventional semiconductor structure.
Figure 6:
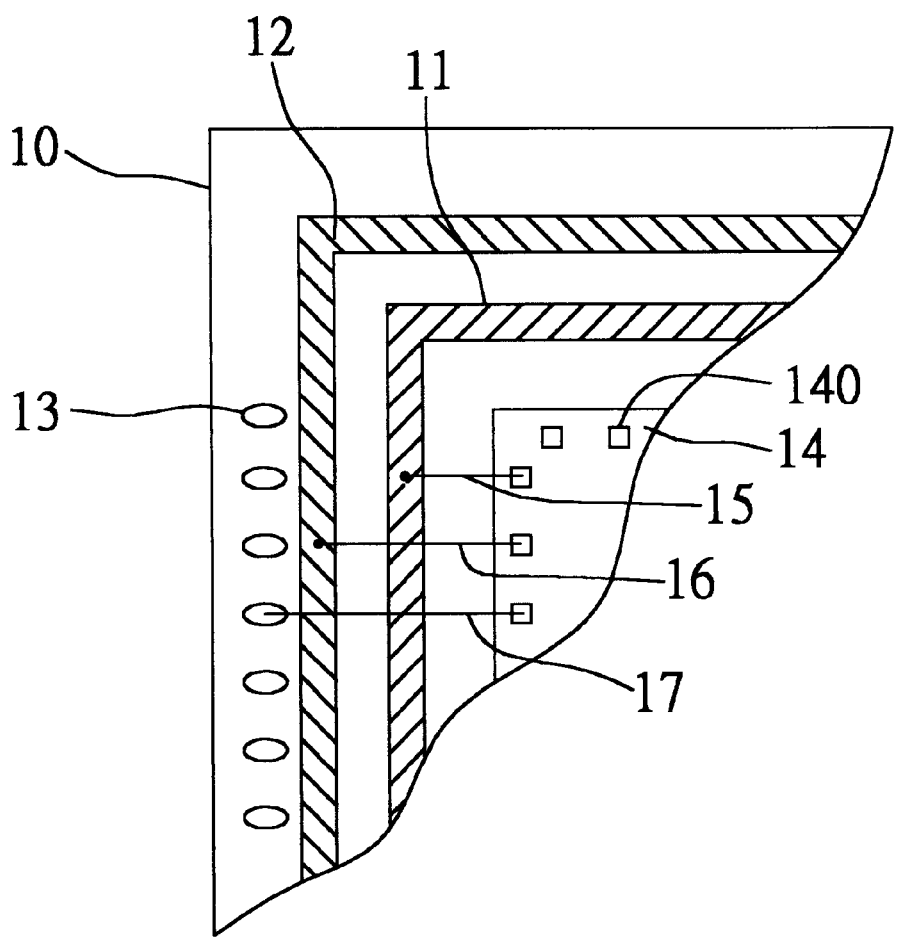
FIG. 6 (PRIOR ART) is a partial top view of a semiconductor structure of FIG. 5.

FIG. 4 illustrates a second preferred embodiment of a semiconductor package of the invention. As shown in the drawing, the semiconductor package 3 of the second embodiment is structurally identical to that of the first embodiment, with the only difference in that, a top surface 301 of a flat portion 300 of a power plate 30 is flush with a top surface 311 of a flat portion 310 of a ground plate 31. During a molding process, a top wall of an encapsulating mold (not shown) can directly abut against and press on the flush top surfaces 301, 311 of the power plate 30 and the ground plate 31, thereby making the top surfaces 301, 311 not encapsulated by an encapsulant 32. After the encapsulant 32 is formed by molding, the top surfaces 301, 311 of the power plate 30 and the ground plate 31 are exposed to outside of the encapsulant 32. Since the power plate 30 and the ground plate 31 are made of metallic materials, the exposed top surfaces 301, 311 thereof allow heat generated from a chip 33 to be effectively dissipated to the atmosphere, so as to desirably improve heat dissipating efficiency of the semiconductor package 3.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A ball grid array semiconductor package, comprising:
a substrate having a first surface and an opposing second surface, the first surface being formed with a chip attach region and a plurality of signal fingers surrounding the chip attach region, the first surface further being defined with a power attach region and a ground attach region in proximity to two sides of the substrate at positions outside the signal fingers;
at least a chip having an active surface and an opposing non-active surface, the active surface being disposed with a plurality of signal pads, power pads and ground pads at peripheral area thereof, wherein the power pads are consolidated to form a power plane on the active surface of the chip and electrically connected to the power plane, and the ground pads are consolidated to form a ground plane on the active surface of the chip and electrically connected to the ground plane; the non-active surface of the chip being attached to the chip attach region of the substrate in a manner that, the power plane and the ground plane of the chip face toward the power attach region and the ground attach region on the substrate, respectively;
a plurality of bonding wires for electrically connecting the signal pads of the chip to the signal fingers on the first surface of the substrate;
a power plate with two ends thereof being respectively attached to the power plane of the chip and the power attach region of the substrate in a manner free of interference with the bonding wires;
a ground plate with two ends thereof being respectively attached to the ground plane of the chip and the ground attach region of the substrate in a manner free of interference with the bonding wires;
an encapsulant formed on the first surface of the substrate, for encapsulating the chip, the bonding wires, the power plate and the ground plate; and
a plurality of solder balls implanted on the second surface of the substrate.

2. The semiconductor package of claim 1, wherein the second surface of the substrate is formed at predetermined positions with a plurality of signal ball pads, power ball pads and ground ball pads, allowing the signal ball pads to be electrically connected to the signal fingers on the first surface of the substrate, and allowing the power ball pads and the ground ball pads to be electrically connected to the power attach region and the ground attach region on the first surface of the substrate, respectively.

3. The semiconductor package of claim 2, wherein the substrate is formed with a plurality of vias, which vias penetrate the substrate and establish electrical connection between the signal ball pads and the signal fingers, between the power ball pads and the power attach region, as well as between the ground ball pads and the ground attach region.

4. The semiconductor package of claim 2, wherein the solder balls are implanted at the signal ball pads, the power ball pads and the ground ball pads on the second surface of the substrate.

5. The semiconductor package of claim 1, wherein the power pads and the ground pads on the active surface of the chip are re-distributed to form a plurality of traces, which traces consolidate and electrically connect the power pads and the ground pads to the power plane and the ground plane, respectively.

6. The semiconductor package of claim 1, wherein the power plate includes a protruding portion, a flat portion and a supporting portion, with the protruding portion being attached to the power plane of the chip and the supporting portion being attached to the power attach region of the substrate, allowing the flat portion to be elevated in position above the chip by the protruding portion and the supporting portion in a manner free of interference with the bonding wires.

7. The semiconductor package of claim 1, wherein the power plate is made of a metallic material.

8. The semiconductor package of claim 1, wherein the power plate is adhered onto the chip and the substrate by an electrically conductive adhesive.

9. The semiconductor package of claim 1, wherein the ground plate includes a protruding portion, a flat portion and a supporting portion, with the protruding portion being attached to the ground plane of the chip and the supporting portion being attached to the ground attach region of the substrate, allowing the flat portion to be elevated in position above the chip by the protruding portion and the supporting portion in a manner free of interference with the bonding wires.

10. The semiconductor package of claim 1, wherein the ground plate is made of a metallic material.

11. The semiconductor package of claim 1, wherein the ground plate is adhered onto the chip and the substrate by an electrically conductive adhesive.

12. A ball grid array semiconductor package, comprising:
a substrate having a first surface and an opposing second surface, the first surface being formed with a chip attach region and a plurality of signal fingers surrounding the chip attach region, the first surface further being defined with a power attach region and a ground attach region in proximity to two sides of the substrate at positions outside the signal fingers;
at least a chip having an active surface and an opposing non-active surface, the active surface being disposed with a plurality of signal pads, power pads and ground pads at peripheral area thereof, wherein the power pads are consolidated to form a power plane on the active surface of the chip and electrically connected to the power plane, and the ground pads are consolidated to form a ground plane on the active surface of the chip and electrically connected to the ground plane; the non-active surface of the chip being attached to the chip attach region of the substrate in a manner that, the power plane and the ground plane of the chip face toward the power attach region and the ground attach region on the substrate, respectively;
a plurality of bonding wires for electrically connecting the signal pads of the chip to the signal fingers on the first surface of the substrate;
a power plate having a protruding portion, a flat portion and a supporting portion, wherein the protruding portion is attached to the power plane of the chip, and the supporting portion is attached to the power attach region of the substrate, allowing the flat portion to be elevated in position above the chip by the protruding portion and the supporting portion in a manner free of interference with the bonding wires;

a ground plate having a protruding portion, a flat portion and a supporting portion, wherein the protruding portion is attached to the ground plane of the chip, and the supporting portion is attached to the ground attach region of the substrate, allowing the flat portion to be elevated in position above the chip by the protruding portion and the supporting portion in a manner free of interference with the bonding wires, and allowing a top surface of the flat portion of the ground plate to be flush with a top surface of the flat portion of the power plate;

an encapsulant formed on the first surface of the substrate, for encapsulating the chip, the bonding wires, the power plate and the ground plate, allowing the top surfaces of the flat portions of the ground plate and the power plate to be exposed to outside of the encapsulant; and a plurality of solder balls implanted on the second surface of the substrate.

13. The semiconductor package of claim 12, wherein the second surface of the substrate is formed at predetermined positions with a plurality of signal ball pads, power ball pads and ground ball pads, allowing the signal ball pads to be electrically connected to the signal fingers on the first surface of the substrate, and allowing the power ball pads and the ground ball pads to be electrically connected to the power attach region and the ground attach region on the first surface of the substrate, respectively.

14. The semiconductor package of claim 13, wherein the substrate is formed with a plurality of vias, which vias penetrate the substrate and establish electrical connection between the signal ball pads and the signal fingers, between the power ball pads and the power attach region, as well as between the ground ball pads and the ground attach region.

15. The semiconductor package of claim 13, wherein the solder balls are implanted at the signal ball pads, the power ball pads and the ground ball pads on the second surface of the substrate.

16. The semiconductor package of claim 12, wherein the power pads and the ground pads on the active surface of the chip are re-distributed to form a plurality of traces, which traces consolidate and electrically connect the power pads and the ground pads to the power plane and the ground plane, respectively.

17. The semiconductor package of claim 12, wherein the power plate is made of a metallic material.

18. The semiconductor package of claim 12, wherein the power plate is adhered onto the chip and the substrate by an electrically conductive adhesive.

19. The semiconductor package of claim 12, wherein the ground plate is made of a metallic material.

20. The semiconductor package of claim 12, wherein the ground plate is adhered onto the chip and the substrate by an electrically conductive adhesive.

* * * * *